(12) United States Patent
Jain et al.

(10) Patent No.: US 12,300,150 B2
(45) Date of Patent: May 13, 2025

(54) COLOR-AGNOSTIC PIXEL REPAIR SITES

(71) Applicant: X Display Company Technology Limited, Dublin (IE)

(72) Inventors: Nikhil Jain, Raleigh, NC (US); Ronald S. Cok, Rochester, NY (US); Christopher Andrew Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 569 days.

(21) Appl. No.: 17/570,585

(22) Filed: Jan. 7, 2022

(65) Prior Publication Data
US 2023/0222960 A1 Jul. 13, 2023

(51) Int. Cl.
*G09G 3/00* (2006.01)
*G01R 31/26* (2020.01)
*G09G 3/30* (2006.01)
*G09G 3/32* (2016.01)

(52) U.S. Cl.
CPC ........... *G09G 3/32* (2013.01); *G01R 31/2635* (2013.01); *G09G 3/30* (2013.01); *G09G 2300/0426* (2013.01); *G09G 2330/08* (2013.01); *G09G 2330/12* (2013.01)

(58) Field of Classification Search
None
See application file for complete search history.

(56) References Cited

U.S. PATENT DOCUMENTS

| | | | |
|---|---|---|---|
| 8,722,458 B2 | 5/2014 | Rogers et al. | |
| 8,889,485 B2 | 11/2014 | Bower | |
| 9,520,537 B2 | 12/2016 | Bower et al. | |
| 9,603,259 B2 | 3/2017 | Bower | |
| 9,786,646 B2 | 10/2017 | Cok et al. | |
| 10,223,962 B2 * | 3/2019 | Meitl | G09G 3/32 |
| 10,224,460 B2 | 3/2019 | Bower et al. | |
| 10,230,048 B2 | 3/2019 | Bower et al. | |
| 10,255,834 B2 | 4/2019 | Cok et al. | |
| 10,395,582 B2 * | 8/2019 | Cok | G09G 3/2003 |
| 10,438,859 B2 | 10/2019 | Cok et al. | |
| 10,468,363 B2 | 11/2019 | Prevatte et al. | |
| 10,777,521 B2 | 9/2020 | Meitl et al. | |
| 10,796,971 B2 | 10/2020 | Cok et al. | |
| 11,265,992 B2 * | 3/2022 | Meitl | H05B 45/52 |
| 2016/0093600 A1 | 3/2016 | Bower et al. | |
| 2017/0186740 A1 * | 6/2017 | Cok | H01L 25/167 |

(Continued)

*Primary Examiner* — Long Pham
(74) *Attorney, Agent, or Firm* — Choate, Hall & Stewart LLP; Michael D. Schmitt

(57) ABSTRACT

A pixel with a color-agnostic repair site includes a pixel controller, a first site for a first light emitter electrically connected to the pixel controller with a first wire, a second site for a second light emitter electrically connected to the pixel controller with a second wire different from the first wire, and a repair site for a repair light emitter. A repair wire can independently electrically connect the repair site to the pixel controller. A repair wire can electrically connect the repair site to the first wire or to the second wire with a jumper. The repair site can electrically connect to the first wire or to the second wire. A first repair wire can electrically connect the repair site to the first wire, a second repair wire can electrically connect the repair site to the second wire, and one of these wires can be cut.

20 Claims, 16 Drawing Sheets

(56) References Cited

U.S. PATENT DOCUMENTS

2018/0342190 A1* 11/2018 Cok .................... G09G 3/2003
2020/0051482 A1    2/2020 Cok et al.
2024/0014129 A1*  1/2024 Radauscher ........ H01L 23/5254

* cited by examiner

COLOR-AGNOSTIC PIXEL REPAIR SITES

CROSS REFERENCE TO RELATED APPLICATIONS

Reference is made to commonly assigned U.S. Pat. No. 9,786,646 entitled Matrix Addressed Device Repair by Cok et al., to commonly assigned U.S. Pat. No. 10,438,859 entitled Transfer Printed Device Repair by Cok et al., and to commonly assigned U.S. Pat. No. 10,796,971 entitled Pressure-Activated Electrical Interconnection with Additive Repair by Cok et al., the disclosures of which are each incorporated herein by reference in their entirety.

FIELD OF THE DISCLOSURE

The present disclosure relates to structures and methods for providing robust and repairable display pixels.

BACKGROUND OF THE DISCLOSURE

Flat-panel displays comprise an array of pixels distributed over a display substrate. Each pixel comprises one or more light emitters, for example organic light-emitting diodes (OLEDs) or inorganic light-emitting diodes (iLEDs), or light valves (as in liquid crystal displays or LCDs). Light-emitting diode displays use materials that emit light when electrically or optically stimulated. Liquid crystal displays use an array of liquid crystal light valves illuminated with a backlight.

Light-emitters or light valves can be controlled with thin-film transistors disposed over the display substrate. Different approaches to controlling light emitters in pixels is described in U.S. Pat. No. 7,943,491. In examples of these approaches, small integrated circuits are formed on a semiconductor wafer. The small integrated circuits, or chiplets, are released from the wafer by etching a layer formed beneath the circuits. A PDMS stamp is pressed against the wafer and the process side of the chiplets is adhered to the stamp. The chiplets are then pressed against a destination substrate or backplane and adhered to the destination substrate. In another example, U.S. Pat. No. 8,722,458, entitled Optical Systems Fabricated by Printing-Based Assembly, teaches transferring light-emitting, light-sensing, or light-collecting semiconductor elements from a wafer substrate to a destination substrate or backplane.

Modern displays can have a large number of pixels disposed at a high resolution over a large display area. It is important that every pixel emits light as desired to avoid perceptible faults in the display. However, it can be difficult or costly to construct displays with no faulty pixels. In order to improve yields and reduce costs, displays with faulty pixels can be repaired, for example reworked, instead of discarded.

There is a need, therefore, for structures and methods for repairing displays and, in particular, for structures and methods that enable repairing or replacing faulty light emitters in display pixels.

SUMMARY

In accordance with embodiments of the present disclosure, a pixel includes a pixel controller, a first site for a first light emitter electrically connected to the pixel controller with a first wire, a second site for a second light emitter electrically connected to the pixel controller with a second wire different from the first wire, and a color-agnostic repair site for a repair light emitter electrically connected to a repair wire. The repair wire can independently electrically connect the repair site to the pixel controller. The repair wire can directly electrically connect the repair site to only the first wire or to only the second wire with a jumper. The repair site can connect to the first wire or to the second wire. A first repair wire can electrically connect the repair site to the first wire, a second repair wire can electrically connect the repair site to the second wire, and one of the first repair wire and the second repair wire can be cut.

The first light emitter can be disposed in the first site and electrically connected to the pixel controller with the first wire. The first light emitter can be a micro-transfer printed light-emitting diode that comprises a broken or separated tether. A second light emitter can be disposed in the second site electrically connected to the pixel controller with the second wire. The second light emitter can be a micro-transfer printed light-emitting diode that comprises a broken or separated tether. The jumper can be a micro-transfer printed jumper comprising a broken or separated tether. In some embodiments, a pixel comprises a repair light emitter disposed in the repair site electrically connected to the pixel controller through at least the repair wire. The repair light emitter can be a micro-transfer printed light-emitting diode that comprises a broken or separated tether. The pixel controller can be a micro-transfer printed integrated circuit that comprises a broken or separated tether. Some embodiments can comprise a pixel substrate and the first site, the second site, and the repair site can be disposed on or over the pixel substrate. The pixel controller can be disposed on or over the pixel substrate. The pixel can be printable and disposed on a source wafer. The pixel substrate can be printed to a destination substrate.

In some embodiments, the pixel further comprises a third site for a third light emitter electrically connected to the pixel controller with a third wire different from the first wire and different from the second wire. The repair wire can electrically connect the repair site to only the first wire, to only the second wire, or to only the third wire with the jumper. The repair site can electrically connect to the first wire, to the second wire, or to the third wire. A first repair wire can electrically connect the repair site to the first wire, a second repair wire can electrically connect the repair site to the second wire, a third repair wire can electrically connect the repair site to the third wire, and only two of the first repair wire, the second repair wire, and the third repair wire are cut.

In some embodiments of the present disclosure, a pixel comprises a first light emitter disposed in the first site electrically connected to the pixel controller with the first wire, a second light emitter disposed in the second site electrically connected to the pixel controller with the second wire, and a repair light emitter disposed in the repair site electrically connected to the pixel controller with the first wire, the second wire, or the repair wire. Either the first light emitter or the second light emitter can be a faulty light emitter and the repair light emitter can emit the same color of light as the faulty light emitter is designed or constructed to emit. The pixel controller can comprise a determination circuit operable to (i) read a switch that is electrically connected to or incorporated in the pixel controller that specifies the faulty light emitter, or (ii) test the repair light emitter to determine the faulty light emitter. The repair light emitter can be electrically connected to the pixel controller through a jumper electrically connected to a wire corresponding to the faulty light emitter. The repair light emitter can be electrically connected to the pixel controller through a wire corresponding to the faulty light emitter.

In some embodiments, a pixel comprises N sites for N light emitters electrically connected to the pixel controller with N corresponding wires, N greater than 1, and the pixel comprises M repair sites for M repair light emitters, M less than N.

In some embodiments of the present disclosure, a pixel further comprises a second color-agnostic repair site electrically connected to a second repair wire disposed in a spatially separate location from the repair site electrically connected to the repair wire. The second repair wire can be electrically connected to the repair wire.

Some embodiments comprise a repair light emitter disposed in the color agnostic repair site, wherein the repair light emitter comprises a repair wire shorting bar in electrical contact with the repair wire. The repair wire shorting bar can be in physical contact with the repair wire.

In some embodiments, a second repair wire is electrically connected to the repair site, the repair wire is electrically connected to the first wire, and the second repair wire is electrically connected to the second wire. A repair light emitter can be disposed in electrical contact with the repair wire and the second repair wire. The repair wire or the first wire can be cut such that the repair light emitter is electrically isolated from the pixel controller or the second repair wire or the second wire can be cut such that the repair light emitter is electrically isolated from the pixel controller. In some embodiments no repair light emitter is disposed on the repair site and (i) the repair wire or the first wire is cut such that the repair site is electrically isolated from the pixel controller or (ii) the second repair wire or the second wire is cut such that the repair site is electrically isolated from the pixel controller.

In some embodiments, a repair display comprises a display substrate and pixels. Each of the pixels can be disposed directly on the display substrate. Each of the pixels can be disposed on a pixel substrate and each pixel substrate can be disposed on the display substrate.

According to some embodiments of the present disclosure, a pixel includes a pixel controller, a first site for a first light emitter electrically connected to the pixel controller with a first wire, a second site for a second light emitter electrically connected to the pixel controller with a second wire different from the first wire and a color-agnostic repair site for a repair light emitter electrically connected to the pixel controller.

According to some embodiments of the present disclosure, a method of making a repair display comprises providing a pixel with a color-agnostic repair site, micro-transfer printing a first light emitter that emits a first color of light in the first site, micro-transfer printing a second light emitter that emits a second color of light different from the first color of light to the second site, testing the first light emitter and the second light emitter wherein the testing determines that the first light emitter or the second light emitter is a faulty light emitter, and micro-transfer printing a repair light emitter in the repair site that emits a same color of light as the faulty light emitter is designed or constructed to emit.

The pixel controller can be used to test the repair light emitter with the pixel controller to determine the color of light emitted by the repair light emitter and control the repair light emitter to emit light. Methods of the present disclosure can comprise cutting wires one or more wires or blowing one or more fuses in a switch using a wire cutter to specify the color of light that can or will be emitted by the repair light emitter when controlled by the pixel controller to emit light. The pixel controller can read the switch to determine the color of light emitted by the repair light emitter and control the repair light emitter to emit the light.

Some embodiments comprise determining the first light emitter is faulty and then printing a jumper to electrically connect the repair wire to the first wire or determining the second light emitter is faulty and then printing a jumper to electrically connect the repair wire to the second wire. Some embodiments comprise determining that the second light emitter is faulty and then using a wire cutter to cut the first wire or determining that the first light emitter is faulty and then using a wire cutter to cut the second wire.

According to some embodiments, a pixel comprises a pixel controller, a first site for a first light emitter electrically connected to the pixel controller with a first wire, a second site for a second light emitter electrically connected to the pixel controller with a second wire different from the first wire, and color-agnostic repair sites, wherein the color-agnostic repair sites overlap such that no other repair emitter can be disposed at any other of the color-agnostic repair sites when one repair emitter is disposed in one of the color-agnostic repair sites. The one repair emitter can be disposed in the one of the repair sites. Each of the repair sites can be electrically connected to a respective repair wire.

The present disclosure provides displays with repairable or repaired pixels, improving manufacturing yields and reducing costs.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
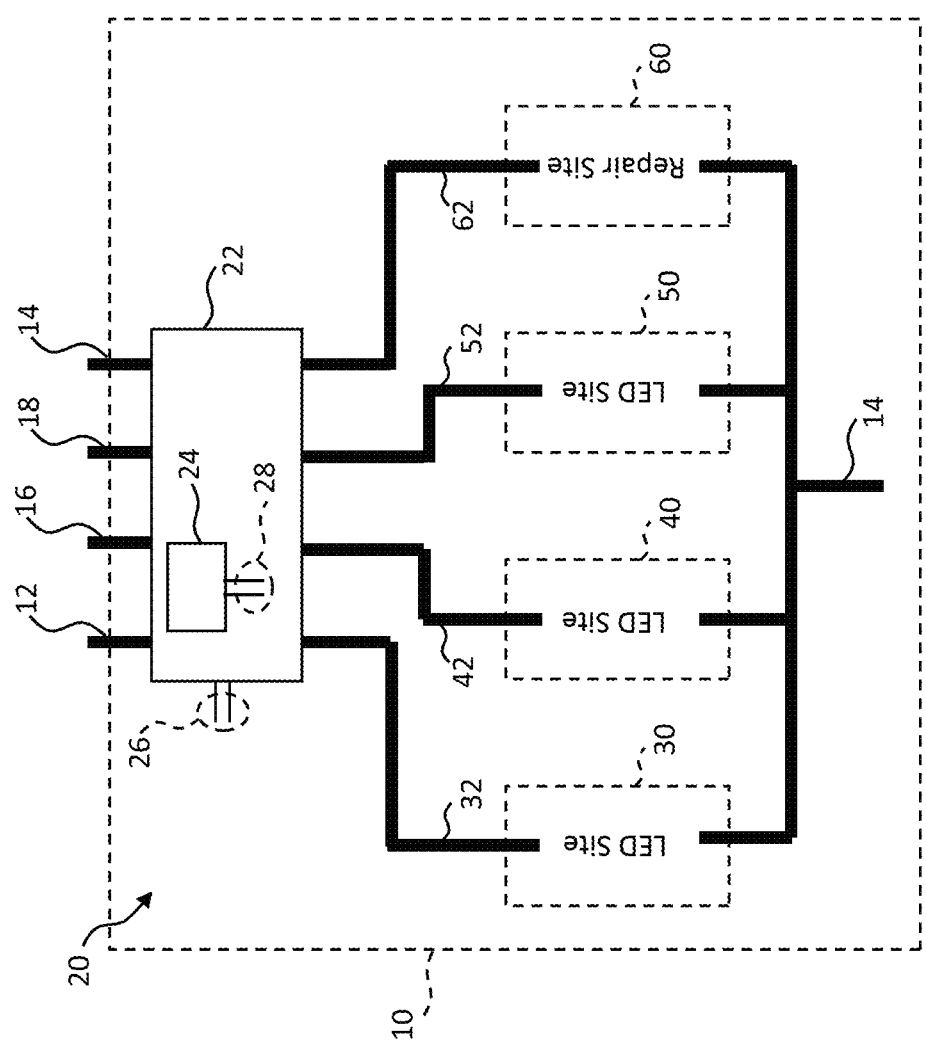
FIG. 1 is a schematic plan view of a display pixel comprising a color-agnostic repair site directly electrically connected to a pixel controller according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides a robust structure and method for providing light-emitting display pixels that can be repaired, in particular display pixels incorporating printed (e.g., micro-transfer-printed) light-emitting diodes (LEDs) such as organic LEDs or inorganic LEDs. The manufacturing process for LEDs requires the deposition and patterning of compound semiconductor epitaxial layers, for example GaAs or GaN, and forming LED electrical contacts on the epitaxial layers over the extent of a semiconductor wafer, for example a 200 mm or 300 mm wafer. It can be difficult to form doped crystalline epitaxial layers without any contamination, inclusions, dislocations, or variation over the extent of the compound semiconductor source wafers. Consequently, LEDs diced from different areas of a compound semiconductor source wafer can have different performances, for example can emit slightly different colors with different efficiencies, or even fail due to particles, dislocations, defects, or inclusions incorporated into the epitaxial layers making up the LED. Such variable or failed LEDs are faulty light emitters or faulty LEDs. Furthermore, the assembly of LEDs into display pixels can be problematic. LEDs can be misplaced or improperly electrically connected to a pixel or control circuit. A pixel comprising a faulty, missing, or improperly electrically connected LED is a faulty pixel and a display comprising a faulty pixel is a faulty display. Faulty displays are generally not suitable for actual use.

Problems with faulty pixels are exacerbated in large, high-resolution displays with many pixels. For example, a 4K display with three-color pixels can have approximately 24 million light emitters. Even a single faulty light emitter can be visible to the human visual system. Given limitations in manufacturing processes, faults do sometimes occur and, rather than discarding faulty displays, faulty pixels are repaired, at least in some cases, thereby improving display manufacturing yields and reducing manufacturing costs. For pixels comprising LEDs, LED repairs can be made by removing and replacing a faulty LED or by providing another LED to supplement the faulty LED and optionally electrically disconnecting the faulty LED. U.S. Pat. No. 9,786,646 entitled Matrix Addressed Device Repair by Cok et al. describes pixel structures with inorganic LEDs and an additional LED location for each LED. An additional LED can be micro-transfer printed into each additional LED location, as needed to replace or supplement a faulty LED. Electrical connections to a faulty LED can be cut to electrically isolate the faulty LED. If, in a three-color pixel, one or more additional LED locations are provided for each LED emitting light of each color in the pixel, for example at least three additional LED locations for three LEDs in a three-color pixel, then the area for the LEDs (inclusive of the additional LEDs) is doubled. Such an arrangement would reduce the possible resolution of a display incorporating such multiple LED locations. U.S. Pat. No. 10,230,048 entitled OLEDs for Micro-Transfer Printing by Bower et al. discloses structures and methods for micro-transfer printing individual organic light-emitting diodes.

Figure 6:
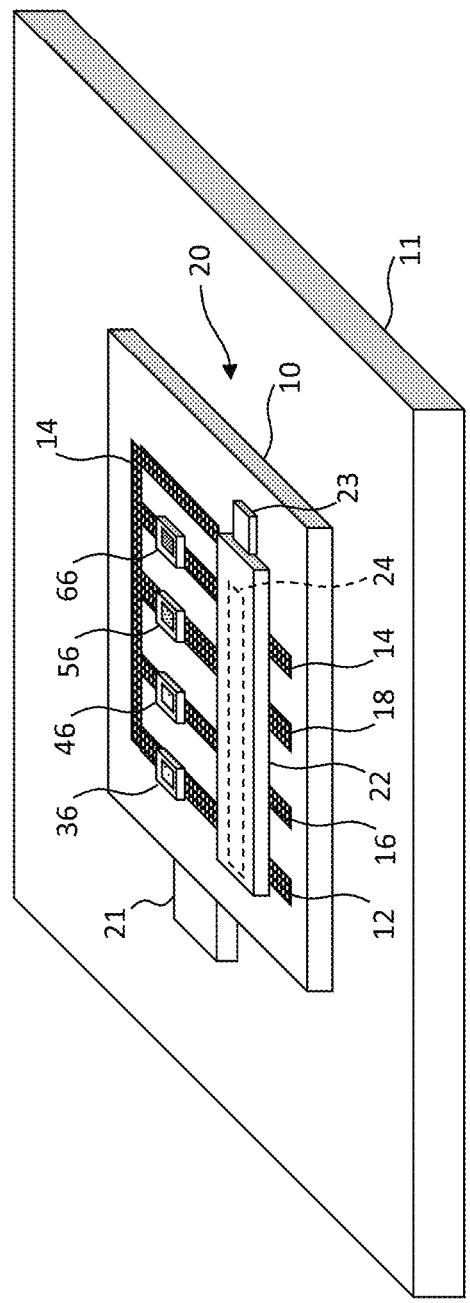
FIG. 6 is a perspective of a repaired pixel comprising a color-agnostic repair site corresponding to FIG. 1 according to illustrative embodiments of the present disclosure.
Figure 13:
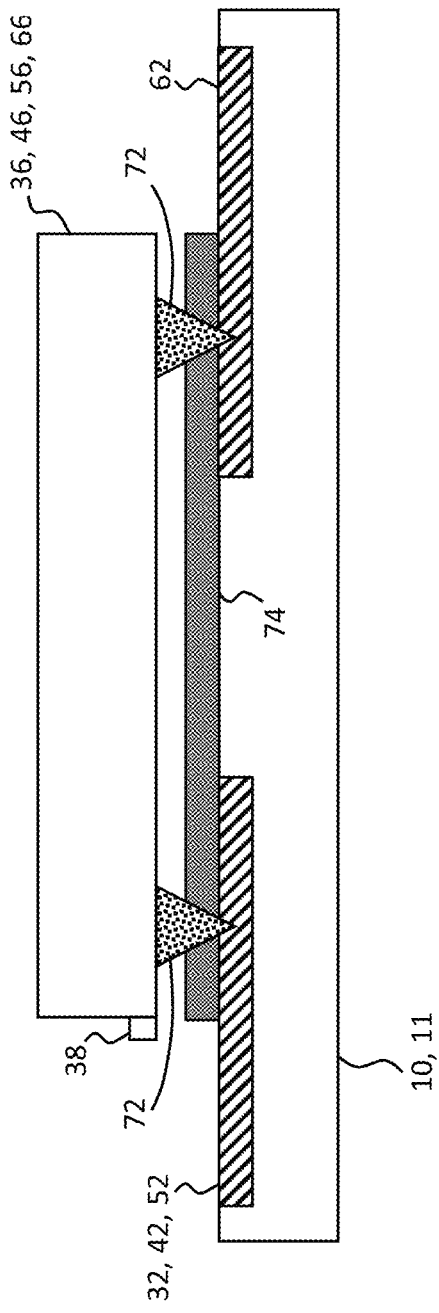
FIG. 13 is a cross section of a micro-transfer-printed micro-device with connection posts useful in understanding embodiments of the present disclosure.

According to embodiments of the present disclosure, a multi-color pixel comprises LEDs (e.g., organic or inorganic LEDs) that emit different colors of light (e.g., different color LEDs). Faulty LEDs can be repaired by providing a replacement (repair) LED in the multi-color pixel. Each multi-color pixel comprises fewer additional LED locations (repair sites) than different color LEDs in the multi-color pixel, for example one additional LED location (one repair site) for a two-color or three-color pixel. By including fewer repair sites than LEDs in a multi-color pixel, the additional area for the multi-color pixel is reduced, enabling smaller multi-color pixels and higher-resolution LED displays while enabling faulty pixel repair to improve yields and reduce costs. However, in such embodiments, if a faulty LED of any color in a pixel is to be repaired, the repair site(s) must accommodate any color LED in the pixel (an LED that emits any color of light in the multi-color pixel), that is the repair site must be color-agnostic. As used herein, a color-agnostic repair site is a repair site into which an LED emitting any color of light emitted by the multi-color pixel can be disposed, for example by micro-transfer printing. Micro-transfer-printed LEDs can be micro-LEDs and can comprise a broken (e.g., fractured) or separated LED tether 38 as a consequence of micro-transfer printing, for example as shown in FIGS. 6 and 13 discussed below.

According to embodiments of the present disclosure, and as shown in FIGS. 1-6, a pixel 20 with a color-agnostic repair site 60 can comprise a pixel controller 22, a first site 30 for a first light emitter 36 electrically connected to pixel controller 22 with a first wire 32, a second site 40 for a second light emitter 46 electrically connected to pixel controller 22 with a second wire 42 different from first wire 32, a third site 50 for a third light emitter 56 electrically connected to pixel controller 22 with a third wire 52, and a repair site 60 for a repair light emitter 66. First light emitter 36 can be a first light-emitting diode 36 (first LED 36, such as an inorganic micro-light-emitting diode), second light emitter 46 can be a second light-emitting diode 46 (second LED 46, such as an inorganic micro-light-emitting diode), third light emitter 56 can be a third light-emitting diode 56 (third LED 56, such as an inorganic micro-light-emitting diode), and repair light emitter 66 can be a repair light-emitting diode 66 (repair LED 66, such as an inorganic micro-light-emitting diode). (Two or more of first, second, third, and repair LEDs 36, 46, 56, 66 are collectively referred to as "LEDs.") Repair light emitter 66 can be similar or identical to one of first, second, and third light emitters 36, 46, 56, either physically or functionally, and can be selected to correspond to and emit the same color of light as a light emitter determined to be faulty (a faulty light emitter) if the faulty light emitter was properly functional. First LED 36 can be a red-light-emitting LED (e.g., a red LED), second LED 46 can be a green-light-emitting LED (e.g., a green LED), and third LED 56 can be a blue-light-emitting LED (e.g., a blue LED). Pixel controller 22 can control first, second, third, and repair LEDs 36, 46, 56, 66 to emit light in response to control signals received by pixel controller 22. Multi-color pixel 20 examples of the present disclosure are illustrated with three LEDs emitting light of different colors, but embodiments of the present disclosure can comprise more than three light emitters that emit more than three different colors of light or can comprise only two light emitters that emit two different colors of light.

In embodiments, a site is a spatial location and area in which a component (e.g., a light emitter such as a light-emitting diode (LED)) can be disposed on a substrate, for example a pixel substrate 10 or display substrate 11. A wire that is in, electrically connected to, or a part of a site is an electrical conductor that can electrically connect to a component (e.g., light emitter) disposed in the site, for example and to pixel controller 22 so that the disposed component (e.g., light emitter) can be controlled by pixel controller 22. A site can be sized and shaped corresponding to a component to be disposed in the site, for example having a lateral extent corresponding to the component. A site can be substantially larger in size than a component intended to be disposed there, provided that any electrical connections included in the site are suitably arranged. In some embodiments, a site includes contact pad(s) that are arranged to be connected to connection post(s) included in a component (e.g., light emitter) as the component is printed, in a connect-at-print fashion, for example as described in U.S. Pat. No. 10,468,363. Sites can also be electrically connected in common with a wire, for example to a ground wire 14 or power wire 12 but not in common to a control signal wire, for example as shown in FIGS. 1-6.

A wire that electrically connects two sites, two components, or electrically connects a site to a component (e.g., pixel controller 22) can be cut and comprise a cut line 70 so that the electrically connected wire is electrically discontinuous. Similarly, a jumper 32 may not be disposed in a jumper site 34 such that an electrical discontinuity exists along an electrical connection, where such discontinuity would not exist once the jumper 32 is disposed (e.g., printed). A wire that electrically connects two sites or electrically connects a site to pixel controller 22 can be electrically continuous (e.g., is not cut and does not include a cut line 70) such that it can conduct an electrical current from one end of the electrically continuous wire to the other end of the electrically continuous wire. Thus, in the present disclosure, an electrical connection between electrically connected site(s) and/or component(s) can be electrically continuous or electrically discontinuous. In the case of an electrically discontinuous electrical connection between component(s), site(s), current could flow from end to end of the electrical connection if any discontinuities were absent. An electrical connection can therefore include wire(s), site(s), jumper(s), cut(s), or a combination of thereof.

According to embodiments of the present disclosure, a first light emitter 36 is disposed in first site 30 and is electrically connected to pixel controller 22 with first wire 32, a second light emitter 46 is disposed in second site 40 and is electrically connected to pixel controller 22 with second wire 42, and a third light emitter 56 is disposed in third site 50 and is electrically connected to pixel controller 22 with third wire 52. Repair light emitter 66 can be disposed in repair site 60 and is electrically connected to pixel controller 22. Any one of first light emitter 36, second light emitter 46, third light emitter 56, repair light emitter 66, and pixel controller 22 can be micro-transfer printed from a source wafer and can comprise a broken or separated LED tether 38 or pixel controller tether 23, respectively, as a consequence of micro-transfer printing. First, second, and third sites 30, 40, 50 for first, second, and third LEDs 36, 46, 56 and repair site 60 for repair LED 66 can be located as desired and as a matter of design within pixel 20 on pixel substrate 10 or display substrate 11 and do not limit embodiments of the present disclosure. Likewise, a variety of shapes for first, second, and third sites 30, 40, 50, first, second, and third LEDs 36, 46, 56, repair site 60, and repair LED 66 can be a matter of design and are not limited to the embodiments illustrated in the figures.

According to some embodiments of the present disclosure, all of first, second, and third LEDs 36, 46, 56 in pixel 20 are functional, no LEDs in pixel 20 are faulty, pixel 20 is not faulty, and no repair LED 66 is disposed in repair site 60. In some such embodiments, pixel controller 22 can control first, second, and third LEDs 36, 46, 56 to emit light as desired in response to control signals provided to pixel controller 22. However, and according to some embodiments of the present disclosure, at least one of first, second, and third LEDs 36, 46, 56 is a faulty LED, pixel 20 is a faulty pixel, and a repair LED 66 corresponding to the faulty LED is disposed in repair site 60 and is electrically connected to and controlled by pixel controller 22 to emit light corresponding to the light the faulty LED was designed to emit. Thus, repair LED 66 can emit light in place of the faulty LED in response to pixel controller 22.

Figure 14:
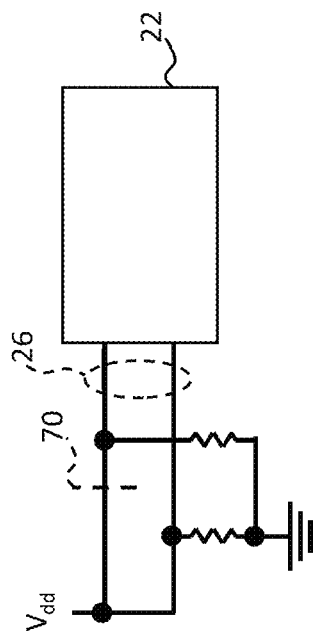
FIG. 14 is an electrical schematic of a multi-bit switch electrically connected to a pixel controller according to illustrative embodiments of the present disclosure.

Repair light emitter 66 can be controlled by, or electrically connected to (or both), pixel controller 22 in a variety of ways using a corresponding variety of methods and according to various embodiments of the present disclosure. As shown in FIG. 1, a repair wire 62 independently electrically connects repair site 60 to pixel controller 22 so that pixel controller 22 can control a repair LED 66 disposed in repair site 60 and electrically connected to repair wire 62. According to some embodiments, pixel controller 22 can comprise a determination circuit 24 operable to determine the color of light emitted by repair light emitter 66 and corresponding to the color of light emitted by the faulty LED if the faulty LED was functional. Pixel controller 22 is operable to control repair LED 66 to emit the determined color of light. In some embodiments, pixel 20 comprises switches or a collection of fuses (e.g., an external switch 26 or an internal switch 28) that specifies (e.g., encodes) the color of light emitted by repair light emitter 66 and read by determination circuit 24. For example, external switch 26 or internal switch 28 can be a two-bit switch with a setting (e.g., '00') that specifies no faulty LEDs, a setting (e.g., '01') that specifies first LED 36 as faulty, a setting (e.g., '10') that specifies second LED 46 as faulty, and a setting (e.g., '11') that specifies third LED 56 as faulty. External switch 26 can comprise electrical connections to power 12 and to high-resistance ground 14 connections (or vice versa) programmed by cutting an electrical connection (or blowing a fuse) to power 12, leaving the switch connections pulled high (or low), as shown in FIG. 14 for a '01' setting. An internal switch 28 or can be similarly programmed internally to pixel controller 22. The switch connections can be cut with, for example, a laser cutter. Since pixel controller 22 can be a (e.g., micro-transfer printed) bare, unpackaged die, it can be accessible to laser light from a laser cutter that can program switch bits or fuses to specify the faulty light emitter (and the repair light emitter 66). In some embodiments, determination circuit 24 actually tests repair light emitter 66, for example by providing one or more voltages and measuring a responsive current to determine a voltage/current relationship for repair light emitter 66. Since each light emitter that emits a different color of light can have a unique voltage/current relationship (from those of the other emitters), the determined voltage/current relationship can uniquely identify repair light emitter 66 so that pixel controller 22 can properly control and operate repair light emitter 66.

Figure 2A:
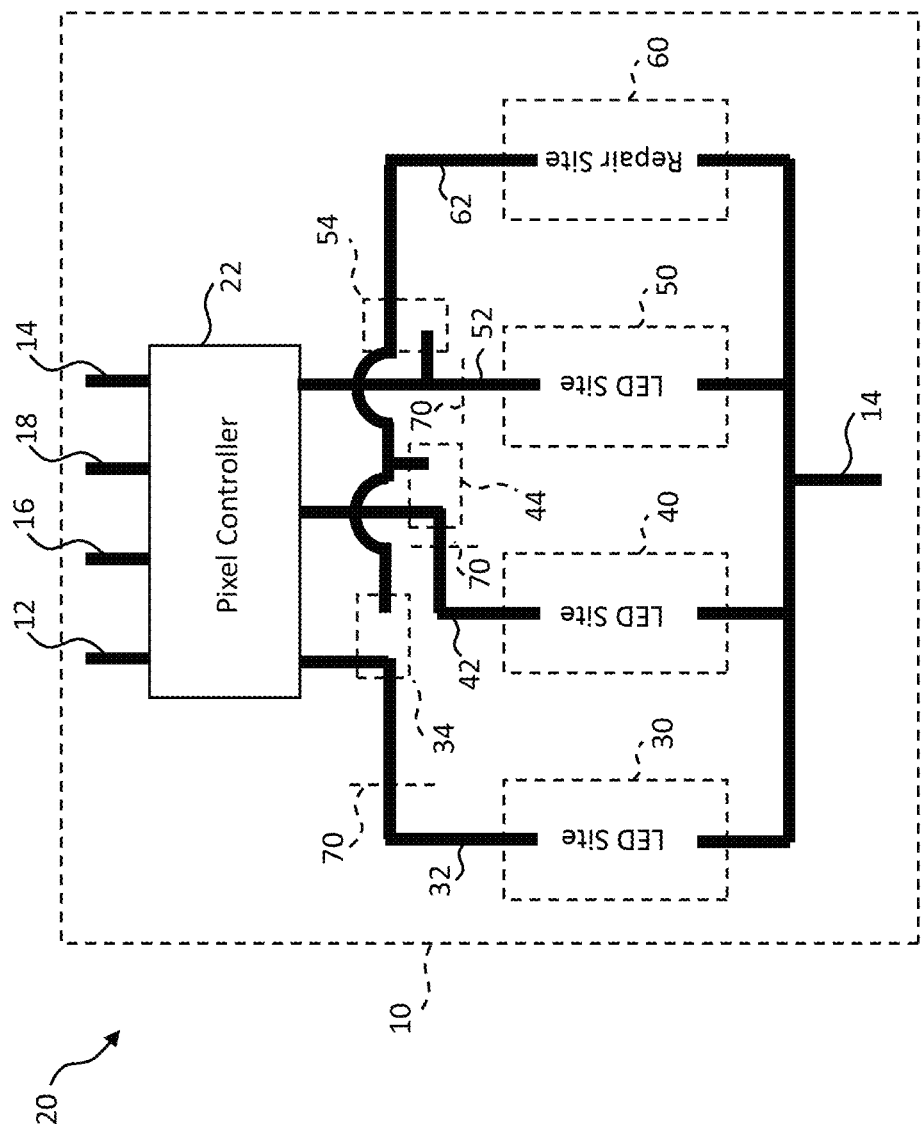
FIGS. 2A-2B are schematic plan views of a display pixel comprising color-agnostic repair site(s) and jumper repair sites according to illustrative embodiments of the present disclosure.
Figure 2B:
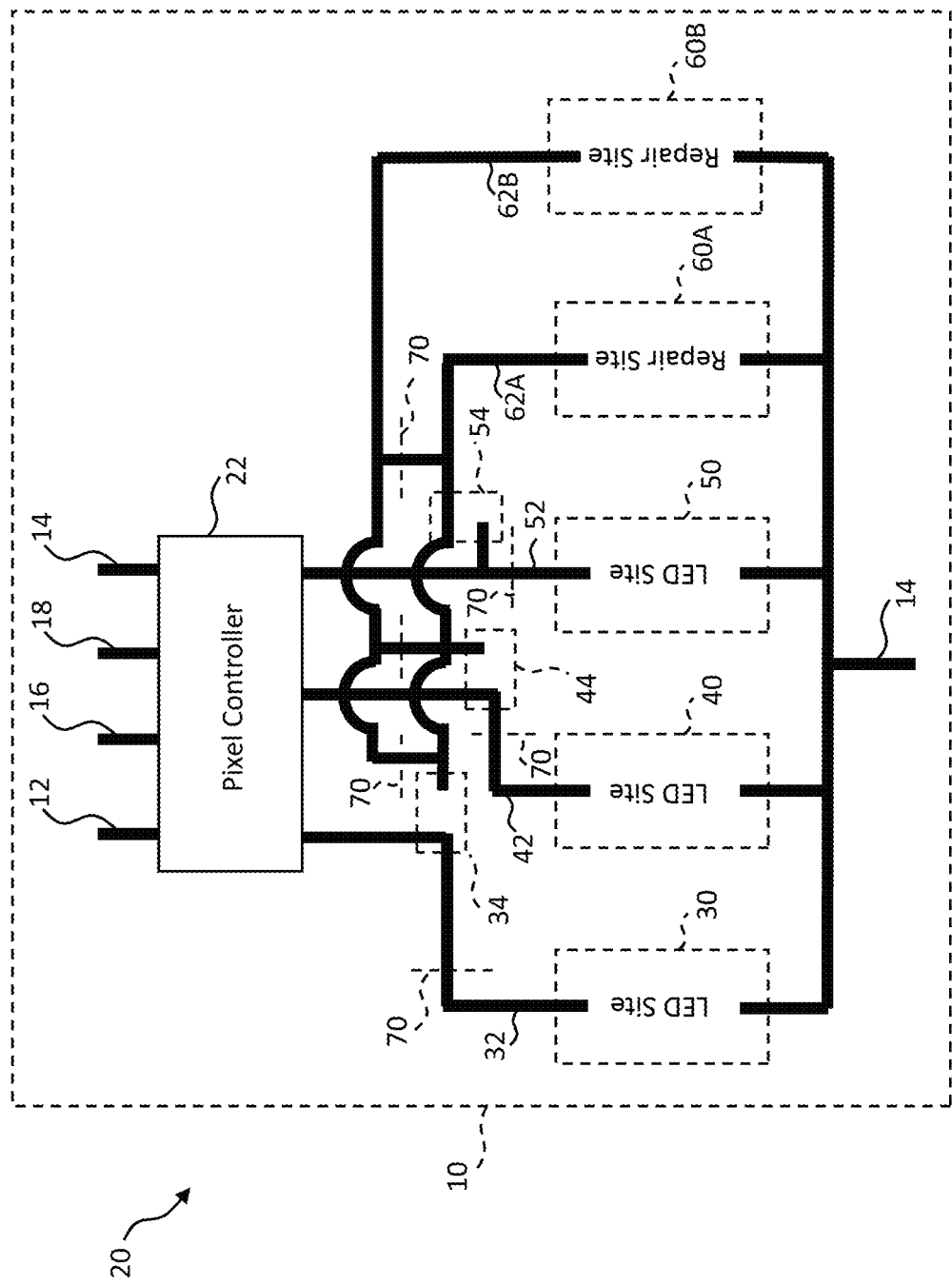
Figure 3:
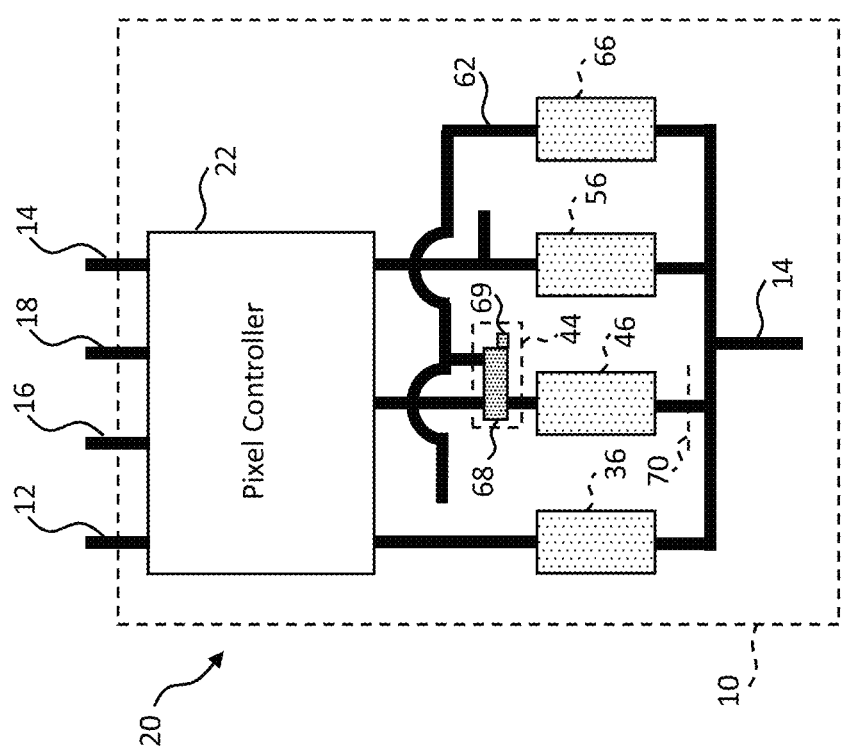
FIG. 3 is a schematic plan view of a repaired pixel comprising a color-agnostic repair site and jumper according to illustrative embodiments of the present disclosure.

According to some embodiments of the present disclosure, and in contrast to the illustration of FIG. 1, repair wire 62 is not independently electrically connected to pixel controller 22. Instead, as shown in FIGS. 2A-6, repair light emitter 66 can be electrically connected to one of first, second, or third wires 32, 42, 52, corresponding to first, second, and third light emitters 36, 46, 56, respectively, whichever is faulty, and acts in the place of the faulty light emitter. For example, if first light emitter 36 is faulty, repair light emitter 66 can be electrically connected to first wire 32 through repair wire 62. If second light emitter 46 is faulty, repair light emitter 66 can be electrically connected to second wire 42 through repair wire 62. If third light emitter 56 is faulty, repair light emitter 66 can be electrically connected to third wire 52 through repair wire 62. Thus, pixel controller 22 need have no knowledge or record of the faulty light emitter or repair light emitter 66 and requires no determination circuit 24, but simply controls the light emitters as it normally would in the absence of any faulty light emitter but operates repair light emitter 66 in place of the faulty light emitter. The faulty LED can be electrically isolated by cutting the corresponding wire with a cut line 70 between repair wire 62 electrical connection to the corresponding wire and the faulty LED (e.g., as shown in FIG. 2) or by cutting the corresponding power or ground wire of the faulty LED with a cut line 70 (e.g., as shown in FIG. 3).

There are several ways in which repair light emitter 66 can be electrically connected to pixel controller 22 through one of first, second, and third wires 32, 42, 52. FIGS. 2A-2B and 3 illustrate embodiments in which repair wire 62 can be electrically connected to one of first, second, and third wires 32, 42, 52 to drive repair light emitter 66 with pixel controller 22 as if it were one of first, second, and third light emitters 36, 46, 56, respectively. In FIG. 2A, repair wire 62 provides an electrical connection of repair site 60 to first wire 32 through a first jumper site 34 in which a jumper 68 can be disposed, repair wire 62 provides an electrical connection of repair site 60 to second wire 42 through a second jumper site 44 in which jumper 68 can be disposed, and repair wire 62 provides an electrical connection of repair site 60 to third wire 52 through a third jumper site 54 in which jumper 68 can be disposed. (Jumpers 68 are not shown in FIG. 2A). In some embodiments, as in FIG. 2A, only one jumper 68 can be disposed in one of first, second, or third jumper sites 34, 44, 54 to electrically connect to one of first, second, and third wires 32, 42, and 52, respectively in order to properly provide signals to repair light emitter 66 disposed in repair site 60. (Disposing multiple jumpers 68 with a single repair light emitter 66 could improperly lead to multiple, possibly conflicting, signals being provided to repair light emitter 66 in a way that would cause repair light emitter 66 to not properly operate as an intended replacement for one of first, second, and third light emitters 36, 46, 56.) Jumper 68 can be disposed in first jumper site 34 if first light emitter 36 is faulty and first wire 32 can be optionally cut between first light emitter 36 and first jumper site 34 or between first light emitter 36 and a common light emitter connection (e.g., a power 12 or ground 14 connection), or both, to isolate the faulty light emitter from pixel controller 22. As shown in FIG. 3, jumper 68 can be disposed in second jumper site 44 if second light emitter 46 is faulty and second wire 42 can be optionally cut between second light emitter 46 and second jumper site 44 or between second light emitter 46 and a common light emitter connection (e.g., a power 12 or ground 14 connection), or both, to isolate the faulty light emitter from pixel controller 22. Jumper 68 can be disposed in third jumper site 54 if third light emitter 56 is faulty and third wire 52 can be optionally cut between third light emitter 56 and third jumper site 54 or between third light emitter 56 and a common light emitter connection (e.g., a power 12 or ground 14 connection), or both, to isolate the faulty light emitter from pixel controller 22.

In some embodiments, and as shown in FIG. 2B, multiple repair sites 60A, 60B (collectively repair sites 60) are provided to enable repair of pixel 20 when there are at least two faulty light emitters. Each repair site 60 can be electrically connected to pixel controller 22 through one of jumper sites 34, 44, 54. Cut lines 70 can be made to isolate the faulty light emitters from repair emitters 66 and to isolate each repair emitter 66 from each other. For example, electrical connections between different repair wires 62 can be cut to isolate repair emitters 66 (e.g., as shown by dashed line segments indicating cut lines 70 in FIG. 2B). In some embodiments, additional jumper sites 34 can be added to provide other or additional electrical connections between a repair emitter 66 and any one of first, second, or third wires 32, 42, 52. As can be seen in FIG. 2B, first repair site 60A and second repair site 60B can be disposed in spatially separate locations (e.g., on pixel substrate 10).

Figure 4A:
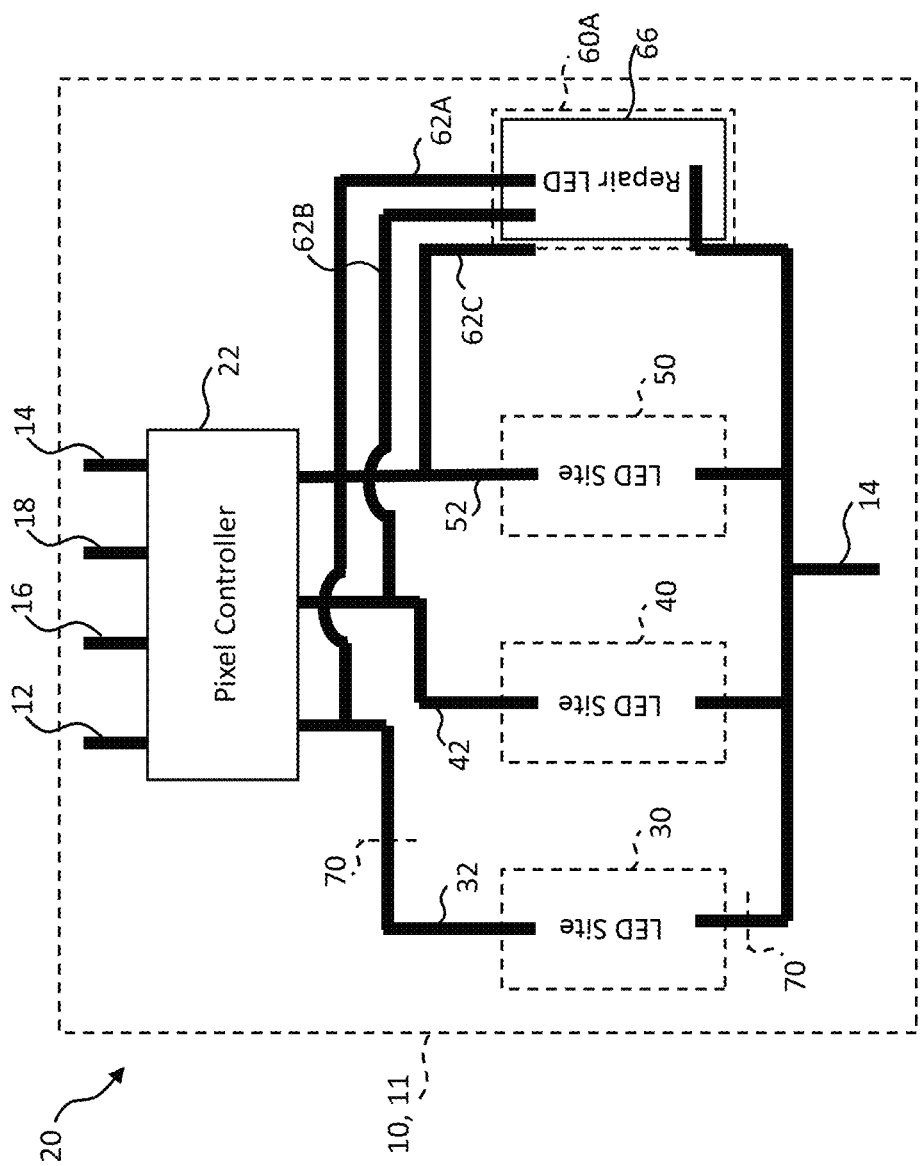
FIGS. 4A-4C are schematic plan views of a display pixel comprising repair sites with light emitters electrically connected to a pixel controller according to illustrative embodiments of the present disclosure.
Figure 4B:
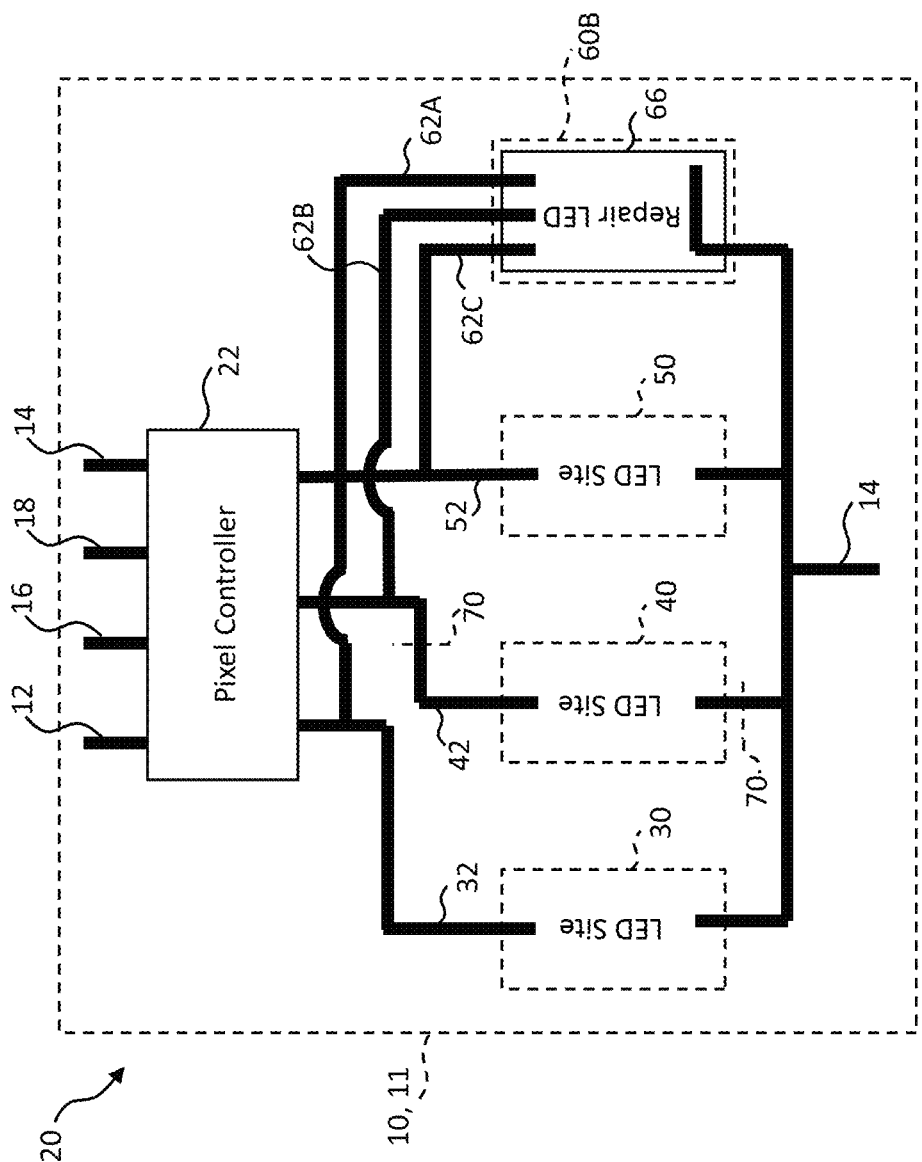
Figure 4C:
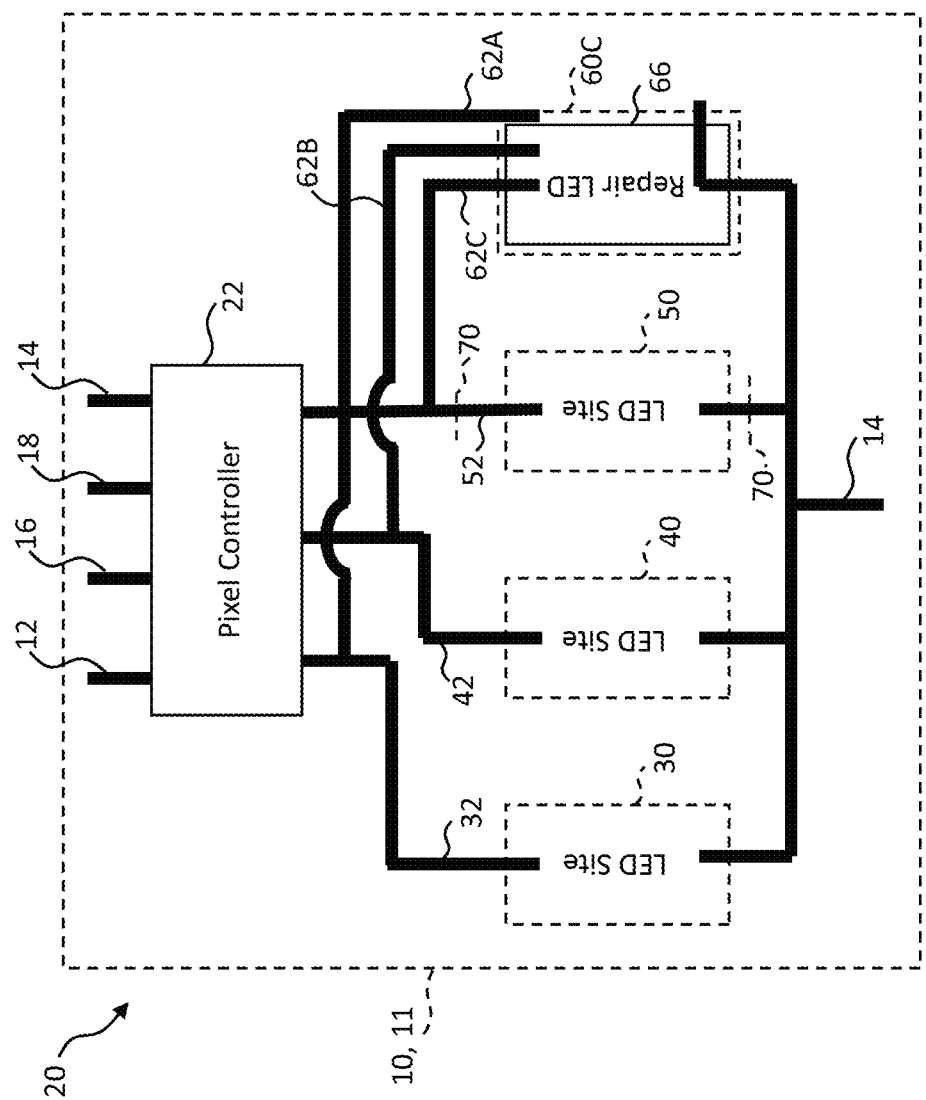

As illustrated in FIGS. 4A-4C, according to some embodiments, a first repair site 60A electrically connects to first wire 32, a second repair site 60B electrically connects to second wire 42, and a third repair site 60C electrically connects to third wire 52 with first, second, or third repair wires 62A, 62B, 62C, respectively, and repair light emitter 66 itself disposed in one of first, second, and third repair sites 60A, 60B, 60C makes an electrical connection to one of first, second, or third repair wires 62A, 62B, 62C, respectively. Thus, an electrical connection between repair light emitter 66 and pixel controller 22 is made by disposing repair light emitter 66 in alignment with one of first, second, and third repair wires 62A, 62B, 62C corresponding to a faulty light emitter (e.g., one of first, second, or third light emitters 36, 46, 56). The electrical connection between repair light emitter 66 and one of first, second, or third repair wires 62A, 62B, 62C can be made by connection posts 72 in repair light emitter 66 as discussed further below with respect to FIG. 13. FIGS. 4A, 4B, and 4C differ in the location of repair sites 60A, 60B, and 60C and their corresponding first, second, and third repair wires 62A, 62B, 62C. FIG. 4A illustrates repair light emitter 66 disposed in first repair site 60A and electrically connected to first repair wire 62A, first wire 32, and pixel controller 22. FIG. 4B illustrates repair light emitter 66 disposed in second repair site 60B to and electrically connected to second repair wire 62B, second wire 42, and pixel controller 22. FIG. 4C illustrates repair light emitter 66 disposed in third repair site 60C and electrically connected to third repair wire 62C, third wire 52, and pixel controller 22. First, second, or third wire 32, 42, or 52 is optionally cut with cut line 70 to isolate a faulty first, second, or third LED 36, 46, or 56 in first, second, or third sites 30, 40, or 50, respectively, from pixel controller 22 and from repair light emitter 66.

Figure 5:
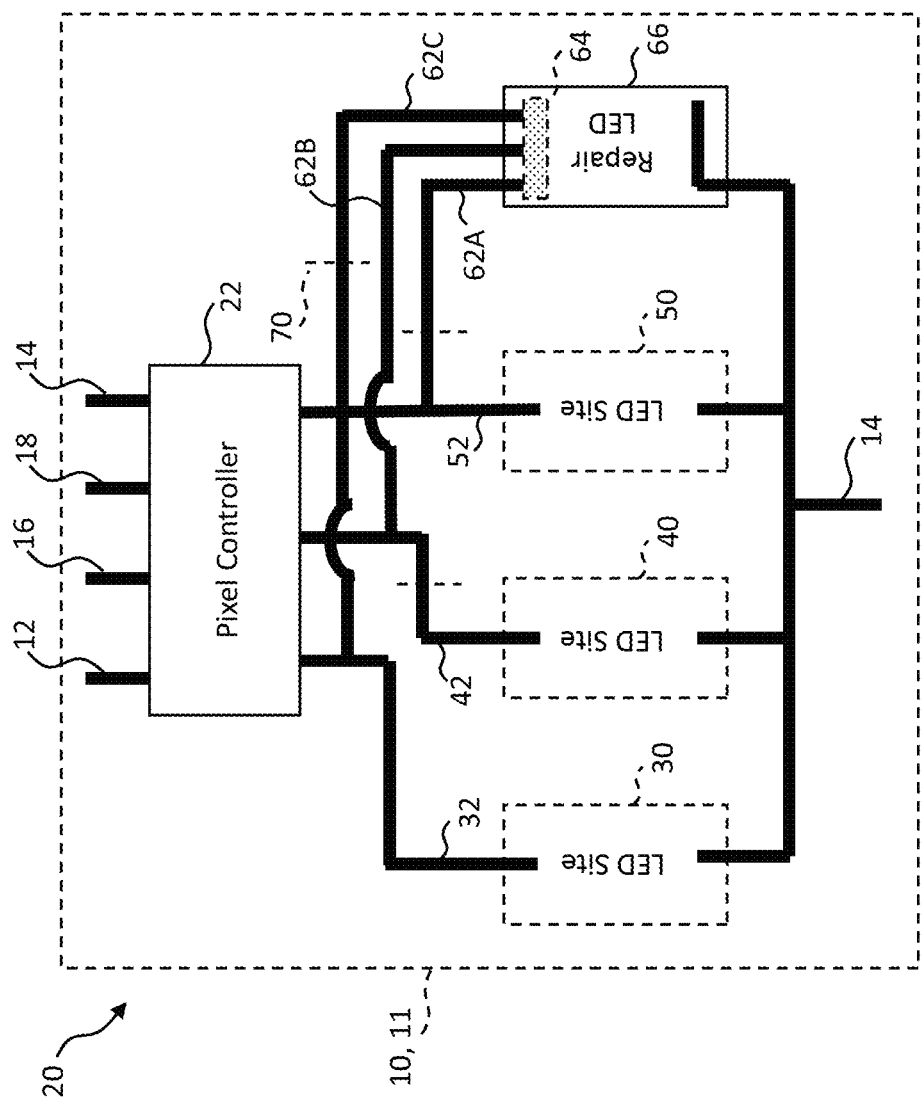
FIG. 5 is a schematic plan view of a display pixel comprising a color-agnostic repair site electrically connected to a pixel controller with a wire-shorting light-emitting diode and cut wires according to illustrative embodiments of the present disclosure.

According to some embodiments and as illustrated in FIG. 5, repair site 60 electrically connects to first wire 32, second wire 42, and third wire 52 with first, second, and third repair wires 62A, 62B, 62C, respectively, and a repair wire shorting bar 64 (an electrically shorting conductor) electrically connects first, second, and third repair wires 62A, 62B, 62C. However, two of the three repair wires are cut with cut lines 70 so that repair LED 66 is electrically connected to only one of first, second, and third wires 32, 42, 52 and electrically connected only once to pixel controller 22. The cut repair wires electrically connect to the functional LEDs in the LED sites and the repair wire that is not cut with a cut line 70 is electrically connected to the wire corresponding to the faulty LED. Thus, repair LED 66 is electrically connected only to the wire corresponding to the faulty LED and can be controlled in place of the faulty LED. Optionally, the wire connecting the faulty LED to the electrically conductive repair wire is cut to isolate the faulty LED from repair LED 66 and pixel controller 22. (FIG. 5 illustrates repair LED 66 functioning in place of faulty second LED 46, but embodiments of the present disclosure are not limited to this specific implementation.) Repair wire shorting bar 64 can be integrated on repair emitter 66 so that first, second, and third repair wires 62A, 62B, 62C are not electrically connected unless repair emitter 66 is present. (If repair wire shorting bar 64 is present when first, second, and third LEDs 36, 46, 56 are tested to determine any faulty emitter, they would inhibit the test, since repair wire shorting bar 64 would short first wire 32, second wire 42, and third wire 52 together so that first, second, and third emitters 36, 46, 56 cannot be independently controlled and tested.)

Figure 7:
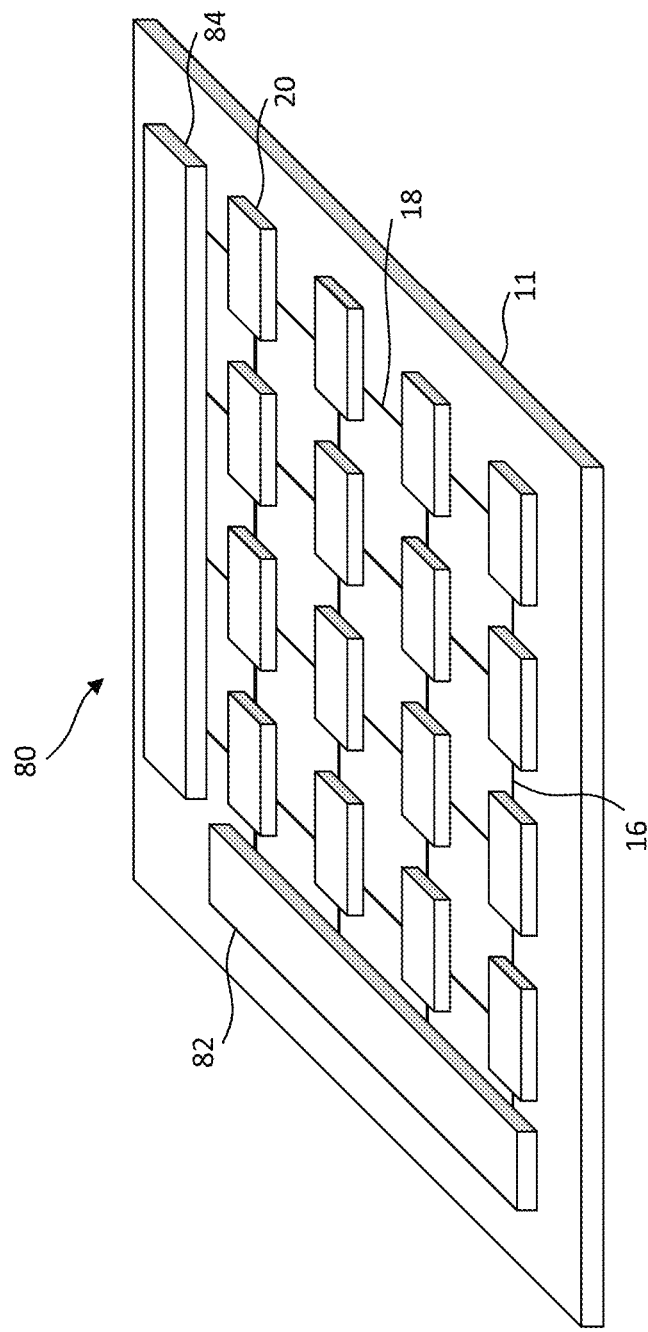
FIG. 7 is a perspective of a display with pixels each comprising a color-agnostic repair site according to illustrative embodiments of the present disclosure.
Figure 8:
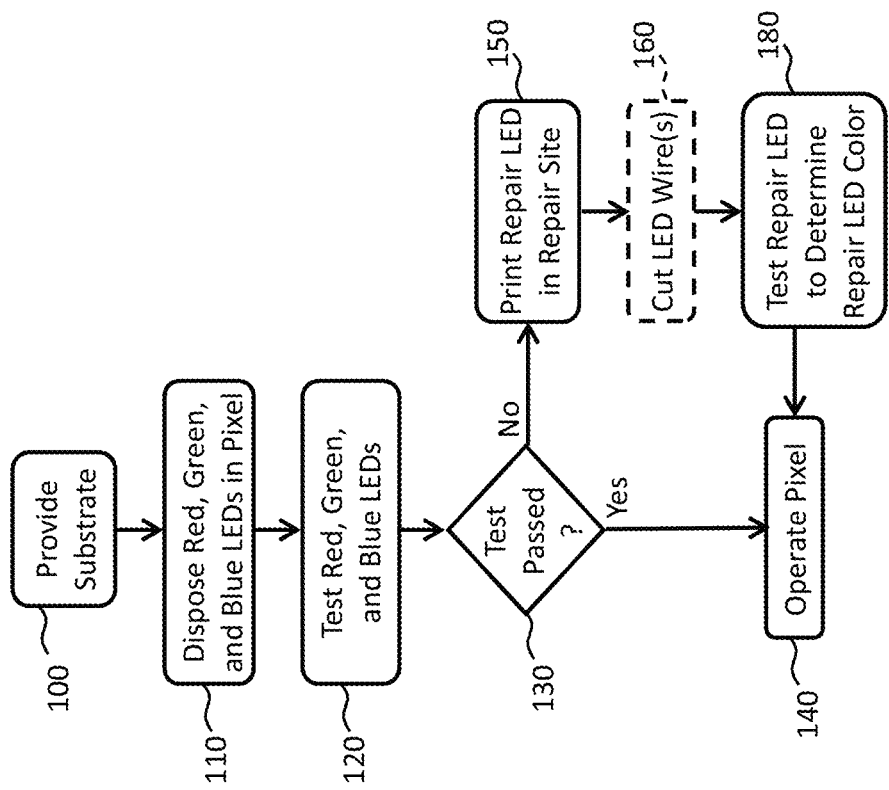
FIGS. 8-12 are flow charts of methods according to illustrative embodiments of the present disclosure.

In embodiments of the present disclosure, first, second, and third emitters 36, 46, 56, first, second, and third wires 32, 42, 52, repair emitter 66, and any repair wires are comprised in a pixel 20 and are disposed on a display substrate 11. In some embodiments, and as shown in FIGS. 6 and 7, first, second, and third LEDs 36, 46, 56, first, second, and third wires 32, 42, 52, repair LED 66, and any repair wire 62 comprise a pixel 20 that is disposed on a pixel substrate 10 separate, distinct, and independent of a display substrate 11. Pixel substrates 10 can be disposed on the display substrate 11 for an array of pixels 20. (Pixel substrates 10 and display substrates 11 are collectively referred to as "substrates.") First, second, and third LEDs 36, 46, 56, pixel controller 22, and repair LED 66 as well as any jumpers 68 can all be micro-transfer printed from respective source wafers onto pixel substrate 10 (or display substrate 11) and can comprise broken (e.g., fractured) or separated tethers, for example LED tether 38, jumper tether 69, or pixel controller tether 23. Similarly, pixels 20 on pixel substrate 10 can be micro-transfer printed from a pixel source wafer onto display substrate 11 and can comprise broken or separated tethers, for example pixel substrate tethers 21. For example, one or more of light emitter(s) 36, 46, 56, repair light emitter 66, and jumper(s) 38 can be printed (e.g., micro-transfer printed) to pixel substrate 10 to form pixel 20 and then pixels 20 can be printed to display substrate 11. Micro-transfer printing enables heterogeneous integration of different micro-devices from different source wafers made in different materials, enabling micro-pixels having excellent performance comprising materials best suited for each function of micro-pixel 20. As shown in FIG. 7, an array of pixels 20 in display 80 are disposed in an array over display substrate 11 and are controlled with row-select signals transmitted on row-select wires 16 (row-select lines) connecting rows of pixels 20 to a row controller 82 and column-data signals transmitted on column-data wires 18 (column-data lines) connecting columns of pixels 20 to a column controller 84, for example using active-matrix control techniques. Pixel controller 22 in each pixel 20 can receive the row-select and column-data signals to control the light emitters (e.g., LEDs) in pixel 20.

As illustrated in the flow diagrams of FIGS. 8-11, embodiments of the present disclosure can be constructed by first providing pixel substrate 10 (or display substrate 11) in step 100. Pixel substrate 10 can have first, second, and third wires 32, 42, 52 and any repair wire 62 disposed and patterned to connect to first, second, third, and repair sites 30, 40, 50, 60 on pixel substrate 10, for example by using photolithography or printing (e.g., inkjet printing). Pixel substrate 10 (or display substrate 11) can be any suitable substrate, for example, a semiconductor (such as silicon), glass, or polymer substrate. Pixel controller 22 can also be micro-transfer printed to pixel substrate 10 or, if pixel substrate 10 is a semiconductor substrate, pixel controller 22 can be constructed in or on and native to pixel substrate 10. First, second, and third LEDs 36, 46, 56 (e.g., red-light-emitting LED, green-light-emitting LED, and blue-light-emitting LED) can be disposed in pixel 20 on the substrate (e.g., by micro-transfer printing) in step 110.

In step 120, first, second, and third LEDs 36, 46, 56 are tested, for example by controlling first, second, and third LEDs 36, 46, 56 with pixel controller 22 to cause each of first, second, and third LEDs 36, 46, 56 to emit light and optically measuring the light output to determine if first, second, and third LEDs 36, 46, 56 are functioning as desired. In some embodiments, first, second, and third LEDs 36, 46, 56 are electrically tested by pixel controller 22 or by external circuits. If first, second, and third LEDs 36, 46, 56 all work satisfactorily (step 130) no further action is necessary and pixel 20 can be operated as part of a display 80 in step 140. If the test (step 120) is not passed (step 130) and one of first, second, and third LEDs 36, 46, 56 is faulty, the faulty LED is recorded and a repair LED 66 is disposed in repair site 60, for example by micro-transfer printing, in step 150. Repair LED 66 is selected to correspond to the faulty LED and to one of first, second, and third LEDs 36, 46, 56 and can emit the same color of light as the faulty LED (if the faulty LED was functional). One of the wires, as discussed above can be cut with cut line 70 in step 160 to isolate the faulty LED and pixel 20 and display 80 can be operated by pixel controller 22 in step 140. In some embodiments, both optical and electrical tests can be carried out. For example, if an LED is faulty, it is also useful to know whether the LED forms an electrical open. If so, additional steps to cut LED wires and isolate the faulty LED can be unnecessary, saving manufacturing time and resources.

Figure 9:
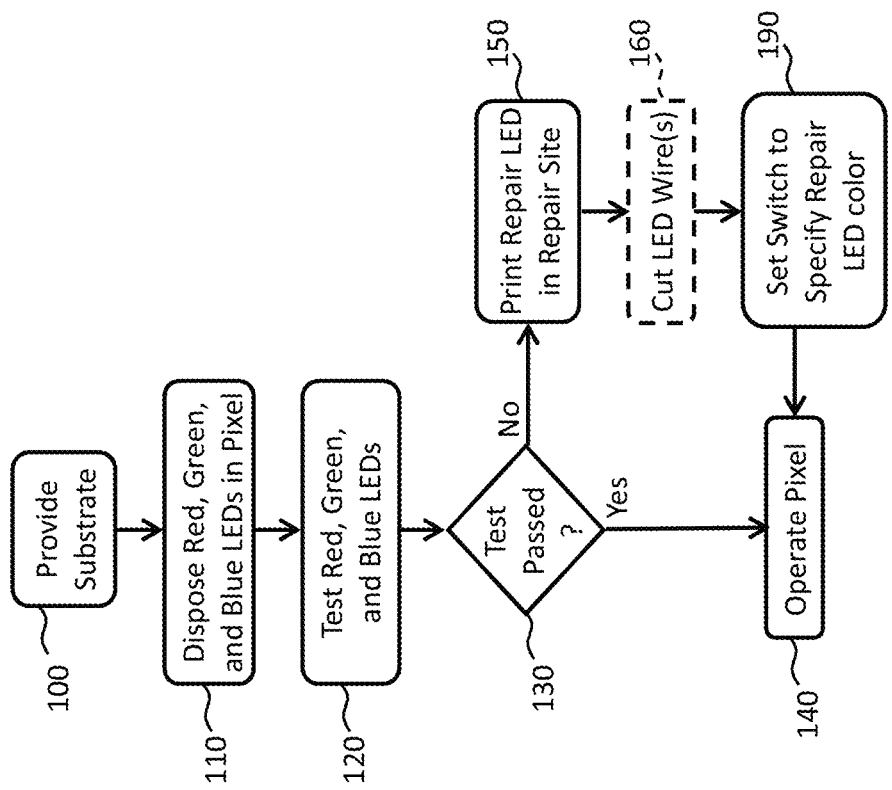

In embodiments such as those illustrated in FIG. 1 having a direct repair wire 62 electrical connection between repair LED 66 and pixel controller 22 (e.g., repair wire 62 is not electrically connected to one of first, second, or third wires 32, 42, 52), pixel controller 22 must have information specifying the type of repair LED 66 (e.g., one of first, second, and third LEDs 36, 46, 56) in order for pixel controller 22 to properly operate repair LED 66. In some embodiments, the faulty LED is not recorded in pixel controller 22 so that pixel controller 22 must garner or be provided with such information. In some embodiments and as illustrated in the flow diagram of FIG. 8 and the schematic of FIG. 1, pixel controller 22 comprises a determination circuit 24 that operates repair LED 66 in step 180 to determine operational characteristics of repair LED 66 (such as a voltage/current relationship), thereby identifying the type of repair LED 66. Once the type of repair LED 66 is identified, it can be operated appropriately by pixel controller 22 (e.g., as a red-, green-, or blue-light-emitting LED) in step 140. In some embodiments and as illustrated in FIG. 9, a switch or fuse, e.g., either internal switch 28 or external switch 26 is set (e.g., by laser cutting) in step 190. The switch setting is then read by pixel controller 22 and used to properly operate repair LED 66 in step 140.

Figure 10:
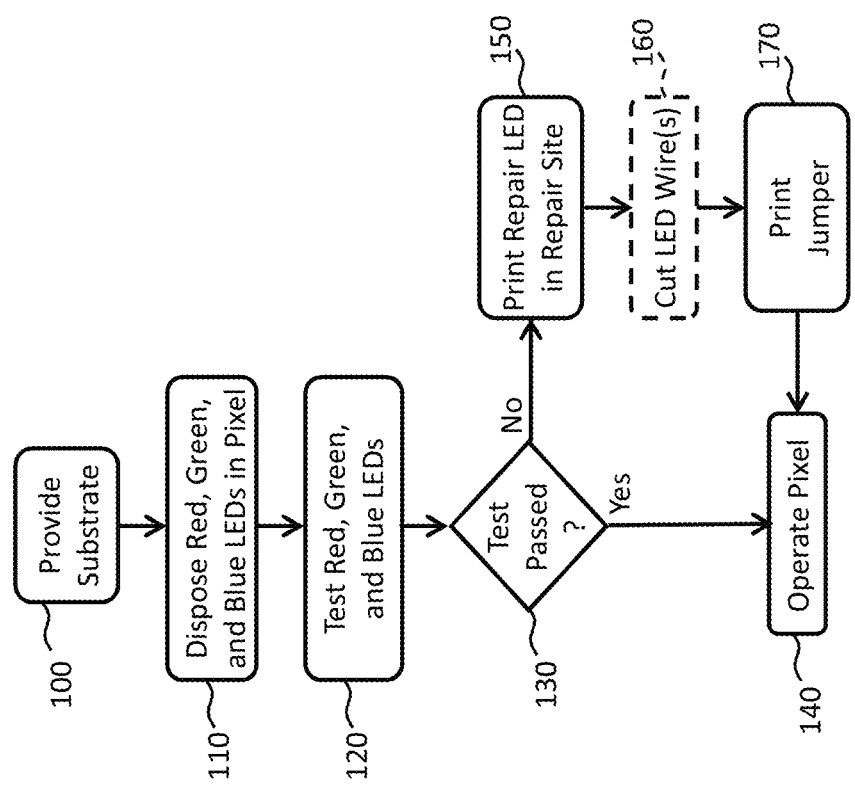

In embodiments such as those illustrated in FIGS. 2A-2B and 3 and as illustrated in FIG. 10, repair LED 66 is printed in step 150 into repair site 60 and jumper 68 is printed in step 170 to provide an electrically continuous electrical connection of repair wire 62 to the wire corresponding to the faulty LED (e.g., jumper 68 is printed to continuously electrically connect repair wire 62 and repair LED 66 to first wire 32 if first LED 36 is faulty, jumper 68 is printed to continuously electrically connect repair wire 62 and repair LED 66 to second wire 42 if second LED 46 is faulty, or jumper 68 is printed to continuously electrically connect repair wire 62 and repair LED 66 to third wire 52 if third LED 56 is faulty). Jumper 68 can be printed by micro-transfer printing and can comprise a broken (e.g., fractured) or separated jumper tether 69 as a consequence of micro-transfer printing, for example as shown in FIG. 3. Optionally, the corresponding wire (e.g., first wire 32 corresponding to a faulty first LED 36, second wire 42 corresponding to a faulty second LED 46, or third wire 52 corresponding to a faulty third LED 56) is cut between the faulty LED and the repair wire or between the faulty LED and a common light-emitter wire such as a ground wire 14 in step 160. Pixel controller 22 can then control repair LED 66 instead of the faulty LED in step 140.

Figure 11:
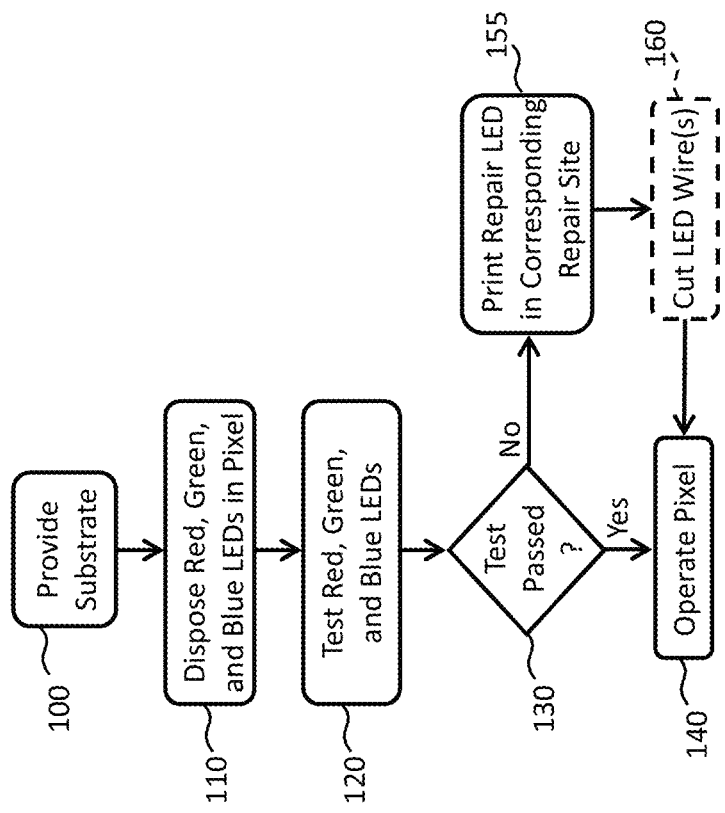

In embodiments, such as those illustrated in FIGS. 4A-4C and as illustrated in FIG. 11, repair LED 66 is printed into the appropriate first, second, or third repair site 60A, 60B, or 60C corresponding to the faulty LED (e.g., first repair site 60A corresponding to a faulty first LED 36, second repair site 60B corresponding to a faulty second LED 46, or third repair site 60C corresponding to a faulty third LED 56) in step 155. Repair LED 66 is then electrically connected by micro-transfer printing to the first repair wire 62A corresponding to a faulty first LED 36, second repair wire 62B corresponding to a faulty second LED 46, or third repair wire 62C corresponding to a faulty third LED 56. Optionally, the corresponding wire (e.g., first wire 32 corresponding to a faulty first LED 36, second wire 42 corresponding to a faulty second LED 46, or third wire 52 corresponding to a faulty third LED 56) is cut with cut line 70 between the faulty LED and the repair wire in step 160 or between the faulty LED and a common light-emitter wire such as a ground wire 14 in step 160.

Figure 12:
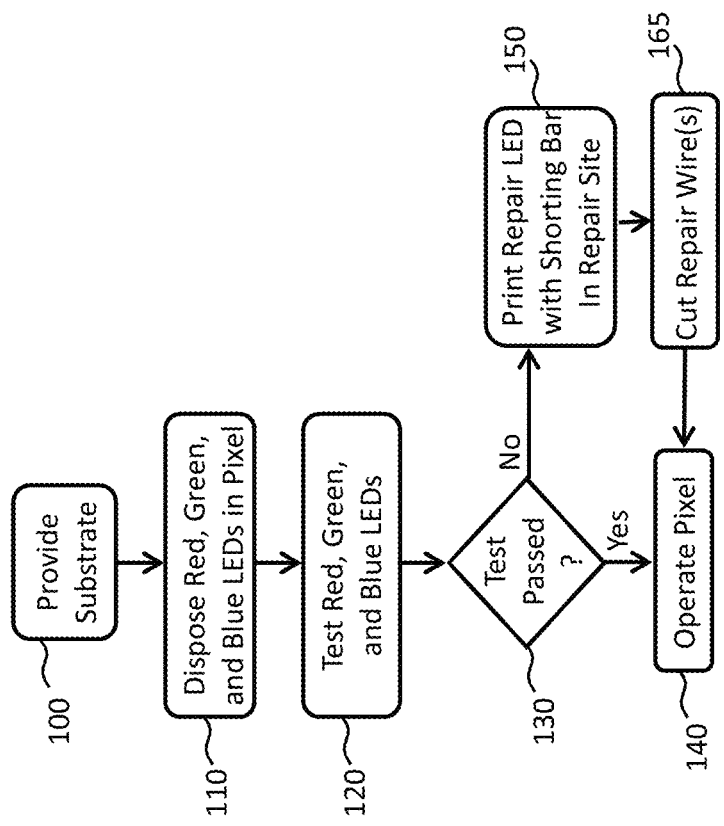

In embodiments such as those illustrated in FIG. 5 and as illustrated in FIG. 12, repair LED 66 comprising a repair wire shorting bar 64 is printed into repair site 60 in step 150. Repair wire shorting bar 64 of repair LED 66 electrically connects all of first, second, and third repair wires 62A, 62B, and 62C. Repair wires corresponding to functional LEDs are cut in step 160, e.g., second and third repair wires 62A, 62C corresponding to a faulty first LED 36, first and third repair wires 62A, 62C corresponding to a faulty second LED 46, or first and second repair wires 62A, 62B corresponding to a faulty third LED 56.

In general, and according to embodiments of the present disclosure, wires can be cut before or after repair LED 66 or jumper 68 is micro-transfer printed.

As illustrated in FIGS. 1-6, pixels 20 comprise one repair site 60. However, and according to embodiments of the present disclosure, pixels 20 can comprise up to one fewer repair sites 60 and repair LEDs 66 than colors of LEDs. For example, if pixel 20 includes two LEDs that emit two different colors of light, then pixel 20 can comprise one repair site 60 and one repair LED 66. If pixel 20 includes three LEDs that emit three different colors of light (e.g., first, second, and third LEDs 36, 46, 56 emitting red, green, and blue light, respectively) then pixel 20 can comprise one repair site 60 and one repair LED 66 or two repair sites 60 and two repair LEDs 66. If pixel 20 includes LED that emit four different colors of light, then pixel 20 can comprise one, two, or three repair site(s) 60 and one, two, or three repair LED(s) 66, respectively. Generally, if pixel 20 includes N LEDs that emit N different colors of light (N>=2), then pixel 20 can comprise up to M repair site(s) 60 and M repair LED(s) 66 (M<N).

In a first process step of a method of the present disclosure and as also shown in FIG. 13, micro-transfer printed devices (e.g., LEDs) are printed on a layer of adhesive 74 disposed on a display substrate 11 or pixel substrate 10, adhesive 74 cured to adhere the micro-transfer printed devices to display substrate 11 or pixel substrate 10, and the devices (e.g., LEDs) tested (as in step 120). In a second process step, a field etch removes exposed cured adhesive 74 (e.g., in repair site 60 or first, second, or third jumper sites 34, 44, 54), a second layer of adhesive 74 is coated on the substrate (e.g., on repair site 60 or jumper sites 34, 44, 54), and second devices (e.g., repair LED 66) micro-transfer printed into repair site 60 as in step 150 or 155, and the second coat of adhesive 74 cured and optionally field etched. This printing and adhesive curing process is described in more detail in U.S. Pat. No. 10,796,971.

In embodiments of the present disclosure, first, second, and third LEDs 36, 46, 56 are electrically connected to first, second, and third wires 32, 42, 52, respectively, pixel controller 22 is electrically connected to first, second, and third wires 32, 42, 52, repair LED 66 and any jumper 68 is electrically connected to repair wire 62 and one of first, second, or third repair wires 62A, 62B, 62C using photo-lithographic processes, for example using patterned wires made by depositing and patterning metals using evaporation or sputtering and masked exposure followed by etching and stripping. In other embodiments and as illustrated in FIG. 13, devices such as LEDs (e.g., any one or more of first, second, and third LEDs 36, 46, 56 and repair LED 66) or jumpers 68 each comprise connection posts 72 that provide a path for continuous electrical connection to the LED or jumper 68. A layer of adhesive 74 is coated over pixel substrate 10 or display substrate 11. An LED or jumper 68 is micro-transfer printed onto pixel substrate 10 or display substrate 11, pressing each connection post 72 through adhesive 74 and into electrical contact with a wire (or contact pad electrically connected to a wire). For example, in some embodiments repair LED 66 with connection posts 72 can be micro-transfer printed so that one connection post 72 is electrically connected to repair wire 62 and one connection post 72 is electrically connected to a ground 14 (or power 12) wire. Similarly, in some embodiments, jumper 68 with connection posts 72 can be micro-transfer printed so that one connection post 72 is electrically connected to repair wire 62 and one connection post 72 is electrically connected to an LED wire, for example second wire 42 as in FIG. 3. For embodiments comprising a repair shorting bar 64, a connection post 72 can be provided for each repair wire and connection posts 72 electrically connected on repair LED 66 to form repair wire shorting bar 64. U.S. Pat. Nos. 9,786,646 and 10,438,859 discloses devices with connection posts 72 micro-transfer printed onto contact pads.

If a micro-device (e.g., a first, second, third, or repair LED 36, 46, 56, 66 or pixel controller 22) does not print to pixel substrate 10 or display substrate 11, the absence of the micro-device can be detected optically and another of the same kind of micro-device can be printed in a second, follow-up step.

Pixel substrate 10 or display substrate 11 (agnostically referred to as "a substrate") can be a printed circuit board, a substrate of a display, or a glass, metal, ceramic, resin, or polymer substrate. In various embodiments, first, second, third, or repair LED 36, 46, 56, 66, jumper 68, or pixel controller 22 are bare die, integrated circuits, or unpackaged integrated circuits and can be or comprise electronic circuits, optical circuits, light-emitting diodes, or micro-light-emitting diodes. First, second, third, or repair LED 36, 46, 56, 66, jumper 68 or pixel controller 22 can be chiplets that are micro-transfer printed onto display substrate 11 or larger modules that are disposed on pixel substrate 10 or display substrate 11. The electrically conductive row-select wires 16 (row-select lines), column-data wires 18 (column-data lines), or first, second, third, or repair wires 32, 42, 52, 62 (collectively lines or wires) can be wires, conductive traces, cured conductive ink, or other electrical conductors suitable for pattern-wise conducting electricity on a substrate and can be made of copper, silver, gold, aluminum, titanium, tantalum, conductive metal, transparent conductive oxides (TCOs) such as indium tin oxide, or any other patterned conductive material. The wires can be patterned and interconnected or electrically isolated over the substrate using photolithographic or printed circuit board techniques.

Pixels 20 can be matrix addressed through row-select wires 16 and column-data wires 18 by supplying signals on row-select wires 16 and column-data wires 18 to the pixel controllers 22. Additional power 12 and ground 14 wires or other control signals can be provided to the pixel controllers 22 (not shown in the figures). Pixels can be active-matrix controlled, for example by pixel controller 22 responsive to row and column controllers 82, 84. In some embodiments, where determination circuit 24 is not needed (e.g., as in FIGS. 2A-5), pixels 20 can be passive-matrix controlled and column controller 84, row controller 82, or a combination of column controller 84 and row controller 82 comprise pixel controller 22. In some such embodiments, if pixel substrates 10 are provided, the LEDs can be disposed on pixel substrates 10 and row and column controllers 82, 84 comprising pixel controller 22 on display substrate 11. Column-data wires 18 can be controlled by column controller 84 and row-select wires 16 can be controlled by row controller 82. Row and column controllers 82, 84 can, in turn, be controlled by a display controller (not shown in the figures).

In operation, row controller 82 and column controller 84 matrix address pixel controllers 22 in an active-matrix configuration or directly matrix address the LEDs in a passive-matrix configuration. Row controller 82 selects a row by providing a row-select signal (for example a voltage or a digital signal such as a digital HIGH value or a one) on row-select wire 16 corresponding to the row of pixels 20 that are addressed. Column controller 84 provides column-data signals on column-data wires 18 and the column data is combined with the row select signal (for example using a digital AND gate or a voltage differential between row-select and column-data wires 16, 18) to enter column data into pixel controller 22 of pixels 20 and cause pixels 20 to operate. In an active-matrix configuration, pixel controller 22 in pixel 20 then drives any connected LEDs to emit light corresponding to the column-data signals. Thus, one row of pixels 20 is addressed at one time. After one row of pixels 20 are addressed, another row can be addressed in the same way, for example a neighboring row, until all of the rows have been addressed. The data provided on column-data wires 18 can be provided by a display controller through column controller 84, for example by shifting data values along a serial shift register until the data is aligned with the column of pixels 20 for which the data is intended for the selected row. Pixel controller 22, row controllers 82, and column controllers 84 can be digital integrated circuits with appropriate driver circuits, such as transistors, for providing electrical signals on the row-select and column-data wires 16, 18.

Non-exhaustive examples of LEDs (e.g., any one or more of first, second, and third LEDs 36, 46, 56) that are faulty include: (i) a shorted LED or one that is overly conductive; (ii) a non-conductive LED or forming an electrical open; (iii) a non-reactive or non-functional LED; (iv) an absent LED such as one that failed to print or adhere adequately to the substrate or is printed to the wrong location; (v) an LED with unintended output, for example the wrong brightness, light output distribution, voltage characteristics, current characteristics, efficiency, or color; or (vi) an LED that functions only intermittently.

Micro-transfer printable electrical jumpers 68 can provide a continuous electrical connection between electrically conductive wires, for example between repair wire 62 and any one of first, second, and third wires 32, 42, 52. Such electrical connections and methods for using them are described in U.S. Pat. Nos. 9,603,259, 10,468,363, and 10,777,521, the contents of all of which are included herein in their entirety.

The LEDs can be constructed using foundry fabrication processes used in the art. Layers of materials can be used, including materials such as metals, oxides, nitrides and other materials used in the integrated-circuit art. Each LED can be a complete semiconductor integrated circuit. The LEDs, jumper 68, or pixel controller 22 can have different sizes, for example, no more than 1000 square microns, no more than 10,000 square microns, no more than 100,000 square microns, no more than 1 square mm, or larger, can have variable aspect ratios, for example at least 1:1, at least 2:1, at least 5:1, or at least 10:1, and can be rectangular or can have other shapes.

In some embodiments of the present disclosure, first, second, third, or repair LEDs 36, 46, 56, 66, jumper 68, or pixel controller 22 are small integrated circuits, for example chiplets, having a thin substrate with a thickness of only a few microns, for example less than or equal to 25 microns, less than or equal to 15 microns, or less than or equal to 10 microns, and, independently, a width or length, or both, of 5-10 microns, 10-50 microns, or 50-100 microns. Such chiplets can be made in a source semiconductor wafer (e.g., a silicon, GaN, or GaAs wafer) having a process side and a back side used to handle and transport the wafer. Chiplets are formed using lithographic processes in an active layer on or in the process side of the source wafer. An empty release layer space is formed beneath the chiplets with tethers connecting the chiplets to the source wafer in such a way that pressure applied against the chiplets breaks the tethers to release the chiplets from the source wafer, for example with a micro-transfer printing stamp. Methods of forming such structures are described, for example, in U.S. Pat. No. 8,889,485 whose contents are incorporated by reference herein in their entirety. Lithographic processes for forming chiplets in a source wafer, for example transistors, wires, and capacitors, can be found in the integrated circuit art.

According to various embodiments of the present disclosure, the native source wafer can be provided with the chiplets, release layer, tethers, and connection posts 72 already formed, or they can be constructed as part of the process of the present disclosure.

In some embodiments, connection posts 72 are electrical connections formed on the process side of an LED that extend generally perpendicular to the surface of the process side. Such connection posts 72 can be formed from metals such as aluminum, titanium, tungsten, copper, silver, gold, or other conductive metals. Connection posts 72 can be formed by repeated masking and deposition processes that build up three-dimensional structures or by etching one or more layers of metal evaporated or sputtered on the process side of the LED. Such structures can also be made by forming a layer above the LED surface, etching a well into the surface, filling it with a conductive material such as metal, and then removing the layer. In some embodiments, connection posts 72 are made of one or more high elastic modulus metals, such as tungsten. As used herein, a high elastic modulus is an elastic modulus sufficient to maintain the function and structure of connection post 72 when pressed into a backplane contact pads (e.g., pixel substrate 10 contact pad or display substrate 11 contact pad). Connection posts 72 can have a variety of aspect ratios and typically have a peak area smaller than a base area. Connection posts 72 can have a sharp point for embedding in or piercing wires (e.g., first, second, third, or repair wires 32, 42, 52, 62, collectively wires). Devices with protruding connection posts 72 generally are discussed in U.S. Pat. No. 8,889,485. Chiplets with connection posts 72 are described in U.S. Pat. Nos. 10,224,460 and 10,468,363, whose contents are incorporated herein by reference in their entirety.

If an optional adhesive 74 is provided on the substrate (e.g., pixel substrate 10 or display substrate 11), each connection post 72 can be driven through adhesive 74 to form an electrical connection with a wire beneath adhesive 74. Adhesive 74 can be cured to more firmly adhere the LEDs to the substrate and maintain a robust electrical connection between connection posts 72 and wires in the presence of mechanical stress. Adhesive 74 can undergo some shrinkage during the curing process that can further strengthen the electrical connectivity and adhesion between connection post 72 and the wires.

Embodiments of the present disclosure provide advantages over other printing methods described in the prior art. By employing connection posts 72 in chiplets and a printing method that provides chiplets on a substrate, a low-cost method for printing chiplets in large quantities over a display substrate 11 is provided. Furthermore, additional process steps for electrically connecting the LEDs to the substrate are obviated.

In some embodiments, pixel controller 22, jumpers 68, or the LEDs are small integrated circuits formed in a semiconductor wafer, for example gallium arsenide or silicon, which can have a crystalline structure. Processing technologies for these materials typically employ high heat and reactive chemicals. However, by employing transfer technologies that do not stress the LEDs or substrate materials, more benign environmental conditions can be used compared to thin-film manufacturing processes. Thus, the present disclosure has an advantage in that flexible substrates, such as polymeric substrates, that are intolerant of extreme processing conditions (e.g., heat, chemical, or mechanical processes), can be employed for the substrate. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses.

The matrix-addressed displays 80 of the present disclosure can be constructed using display and thin-film manufacturing method independently of or in combination with micro-transfer printing methods, for example as are taught in U.S. Pat. No. 9,520,537 and in U.S. patent application Ser. No. 14/822,868, filed Sep. 25, 2014, entitled Compound Micro-Assembly Strategies and Devices, the contents of which are incorporated by reference herein in their entirety.

In the present disclosure, wires are described as electrically connecting components (e.g., pixel controller 22 and light emitters 36, 46, 56) while also being cut. In understanding the description, it should be recognized that the cut presents an electrical discontinuity, however, but for the cut, a continuous electrical pathway would exist along the wire. That is, unless expressly stated or otherwise clear from context, when two components are described as electrically connected, there may or may not be a cut present along the connection. For example, some embodiments are described where a wire is disposed that electrically connects pixel controller 22 and a light emitter 36, 46, 56 (or light emitter site 30, 40, 50 in which light emitter 36, 46, 56 is then disposed (e.g., printed)) and thus can be electrically continuous. As further described previously, after testing light emitter 36, 46, 56, the wire may be cut, thereby presenting an electrical discontinuity within the electrically connected pixel controller 22 and light emitter 36, 46, 56. Moreover, it should be understood that a jumper site 34 can act, in part, to electrically connect two components (e.g., pixel controller 22 and light emitters 36, 46, 56), whether or not a jumper 68 is present at the jumper site 34 where the electrical connection is electrically discontinuous before jumper 68 is disposed (e.g., printed) and electrically continuous once the jumper 68 has been provided (e.g., printed). A single electrical connection can include one or more jumper sites 68, one or more cuts (with corresponding cut lines 70), or both. An electrical connection can be electrically continuous or discontinuous and may change from being electrically continuous to being electrically discontinuous or vice versa as part of a fabrication, for example if a cut is introduced (continuous to discontinuous) or jumper is disposed (discontinuous to continuous) as may be the case after testing light emitter(s).

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween. Furthermore, the terms "row" and "column" can be interchanged.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 pixel substrate
11 display substrate
12 power/power wire
14 ground/ground wire
16 row-select wire
18 column-data wire
20 pixel
21 pixel substrate tether
22 pixel controller
23 pixel controller tether
24 determination circuit
26 external switch
28 internal switch
30 first site
32 first wire
34 first jumper site
36 first light emitter/first emitter/first LED
38 LED tether
40 second site
42 second wire
44 second jumper site
46 second light emitter/second emitter/second LED
50 third site
52 third wire
54 third jumper site
56 third light emitter/third emitter/third LED
60 repair site
60A first repair site
60B second repair site
60C third repair site
62 repair wire
62A first repair wire
62B second repair wire
62C third repair wire
64 repair wire shorting bar
66 repair light emitter/repair emitter/repair LED
68 jumper
69 jumper tether
70 cut line
72 connection post
74 adhesive
80 display
82 row controller
84 column controller
100 provide substrate step
110 dispose red, green, and blue LEDs in pixel step
120 test red, green, and blue LEDs step
130 test passed step
140 operate pixel step
150 print repair LED step
155 print repair LED in corresponding repair site step
160 cut LED wire(s) step
165 cut repair wire(s) step
170 print jumper step
180 test repair LED to determine repair LED color step
190 set switch to specify repair LED color step

The invention claimed is:

1. A pixel, comprising:
a pixel controller;
a first site for a first light emitter electrically connected to the pixel controller with a first wire;
a second site for a second light emitter electrically connected to the pixel controller with a second wire different from the first wire; and
a color-agnostic repair site for a repair light emitter electrically connected to a repair wire,
wherein the pixel controller comprises a circuit operable to provide electrical current to the first wire, to provide electrical current to the second wire, and to provide electrical current to the repair wire.

2. The pixel of claim 1, wherein the repair wire electrically connects the repair site to the pixel controller independently from the first wire and independently from the second wire so that the repair wire is not directly electrically connected to the first wire and the repair wire is not directly electrically connected to the second wire.

3. The pixel of claim 1, wherein the repair wire electrically connects the repair site to only the first wire or to only the second wire with a jumper.

4. The pixel of claim 3, wherein the jumper is a micro-transfer printed jumper comprising a broken or separated tether.

5. The pixel of claim 1, wherein the repair wire directly electrically connects the repair site to the first wire and not to the second wire or wherein the repair wire directly electrically connects the repair site to the second wire and not to the first wire.

6. The pixel of claim 1, wherein the repair wire is a first repair wire that is electrically connected to the repair site and is electrically connected to the first wire and the pixel further comprises a second repair wire that is electrically connected to the repair site and is electrically connected to the second wire, and one of the first repair wire and the second repair wire is cut.

7. The pixel of claim 1, comprising a first light emitter disposed in the first site electrically connected to the pixel controller with the first wire.

8. The pixel of claim 7, wherein the first light emitter is a micro-transfer printed light-emitting diode that comprises a broken or separated tether.

9. The pixel of claim 1, comprising a second light emitter disposed in the second site electrically connected to the pixel controller with the second wire.

10. The pixel of claim 9, comprising a substrate and wherein the second light emitter is a micro-transfer printed light-emitting diode that comprises a broken or separated tether as a consequence of micro-transfer printing the light-emitting diode from a source wafer to the substrate.

11. The pixel of claim 1, comprising a repair light emitter disposed in the repair site electrically connected to the pixel controller through at least the repair wire.

12. The pixel of claim 11, wherein the repair light emitter is a micro-transfer printed light-emitting diode that comprises a broken or separated tether.

13. The pixel of claim 1, wherein the pixel controller is a micro-transfer printed integrated circuit that comprises a broken or separated tether.

14. The pixel of claim 1, comprising a pixel substrate, wherein the first site, the second site, and the repair site are disposed on the pixel substrate.

15. The pixel of claim 14, wherein the pixel substrate has been printed to a destination substrate.

16. The pixel of claim 1, comprising:
(i) a first light emitter disposed in the first site electrically connected to the pixel controller with the first wire,
(ii) a second light emitter disposed in the second site electrically connected to the pixel controller with the second wire, and
(iii) a repair light emitter disposed in the repair site electrically connected to the pixel controller, wherein either the first light emitter or the second light emitter is a faulty light emitter and the repair light emitter emits a same color of light as the faulty light emitter is constructed to emit.

17. The pixel of claim 16, wherein
a) the pixel controller comprises a determination circuit operable to (i) determine current flow through a switch that is electrically connected to or incorporated in the pixel controller that specifies the faulty light emitter, or (ii) test the repair light emitter to determine the faulty light emitter,
b) the repair light emitter is electrically connected to the pixel controller through a jumper electrically connected to a wire corresponding to the faulty light emitter, or
c) the repair light emitter is electrically connected to the pixel controller through a wire corresponding to the faulty light emitter.

18. The pixel of claim 1, comprising a repair light emitter disposed in the color-agnostic repair site, wherein the repair light emitter comprises a repair wire shorting bar in electrical contact with the repair wire.

19. The pixel of claim 1, further comprising a second repair wire electrically connected to the repair site, wherein the repair wire is electrically connected to the first wire and the second repair wire is electrically connected to the second wire.

20. The pixel of claim 19, comprising a repair light emitter disposed in electrical contact with the repair wire and the second repair wire.

\* \* \* \* \*